(12) United States Patent
Zhang

(10) Patent No.: US 6,285,863 B1
(45) Date of Patent: Sep. 4, 2001

(54) SYSTEM AND METHOD FOR PROVIDING AUTOMATIC GAIN CONTROL WITH HIGH DYNAMIC RANGE

(75) Inventor: Zexiang Zhang, Parsippany, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/448,237

(22) Filed: Nov. 24, 1999

(51) Int. Cl.[7] .................................................. H04B 1/06
(52) U.S. Cl. ................................ 455/234.1; 455/235.1; 455/245.1; 330/278; 330/282; 330/291
(58) Field of Search ............................... 455/226.1, 226.2, 455/226.3, 230, 232.1, 234.1, 235.1, 240.1, 245.1, 250.1, 251.1; 330/75, 86, 151, 278, 282, 291

(56) References Cited

U.S. PATENT DOCUMENTS

| | | | |
|---|---|---|---|
| 4,385,400 | * | 5/1983 | Malchow ........................... 455/234.1 |
| 5,493,712 | * | 2/1996 | Ramesh et al. .................... 455/235.1 |
| 5,581,213 | * | 12/1996 | Linder et al. ......................... 330/282 |
| 5,724,652 | * | 3/1998 | Graham et al. .................... 455/234.1 |
| 5,737,033 | * | 4/1998 | Masuda ............................. 455/240.1 |

* cited by examiner

Primary Examiner—Nay Maung
Assistant Examiner—Quochien B. Vuong
(74) Attorney, Agent, or Firm—F. Chau & Associates, LLP

(57) ABSTRACT

A system and method for providing automatic gain control (AGC) with high dynamic range. An AGC system comprises an open loop control system and a closed loop control system. The open control loop system senses the power level of an input signal and preprocesses the input signal based on its sensed power level. For instance, a strong input signal is attenuated by a fixed level via an analog attenuator, a weak input signal is amplified by a fixed factor via a low noise amplifier, and an intermediate level input signal is directly passed to the closed loop control system of the AGC without any attenuation or amplification. By preprocessing the input signal, the closed loop control system can operate in a range that is optimal for its performance. For instance, a gain variable amplifier of the closed loop control circuit can be prevented from operating in a high attenuation status where its noise figure is very high. A wide band receiver using the AGC system may have a dynamic range over 100 dB.

22 Claims, 4 Drawing Sheets

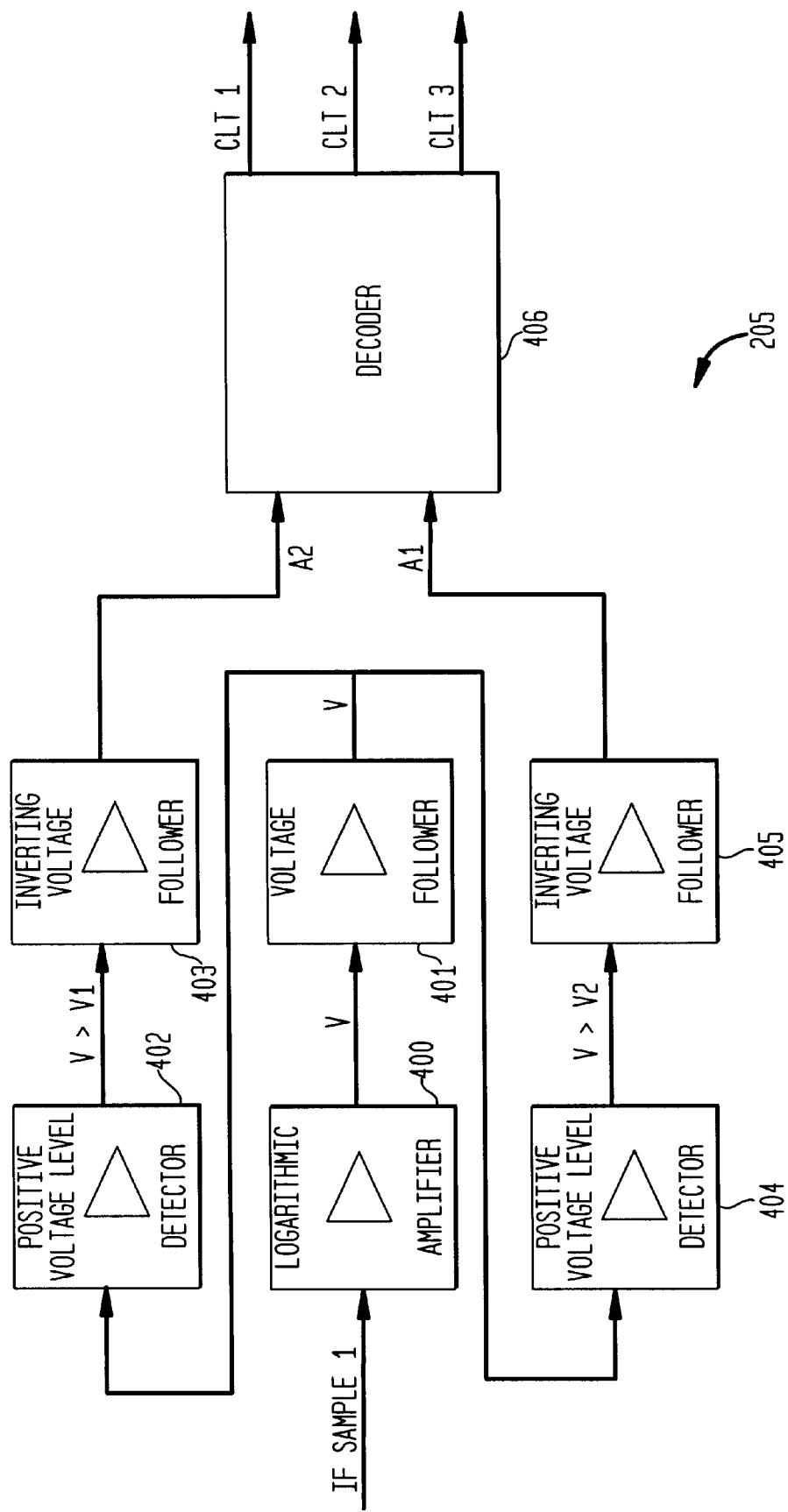

SYSTEM AND METHOD FOR PROVIDING AUTOMATIC GAIN CONTROL WITH HIGH DYNAMIC RANGE

BACKGROUND

1. Technical Field

The present invention relates generally to wide-band code division multiple access (WCDMA) receivers and other receivers for wireless communications. More particularly, the present invention relates to system and method for providing an automatic gain control (AGC) system with high dynamic range (over 100 dB), whereby the AGC can operate over a broad range of varying signal level while maintaining a good signal-to-noise (SN) ratio performance over the entire signal varying range and maintaining inter-modulation components at low levels.

2. Description of Related Art

In general, wireless communication systems employing wide-band receivers (e.g., WCDMA receivers) typically share one carrier channel among a plurality of users. As a result, the signal strength may vary over a very wide range depending on factors such as the distance between a mobile station and a service station and the number of neighboring subscribers sharing the same RF carrier. Indeed, the signal received by a service center or by a mobile station may vary over a 90 dB range and a received signal may even be as high as −25 dBm.

A conventional wide-band receiver typically comprises a RF-IF (radio frequency—intermediate frequency) section that inlcudes an AGC circuit. In general, the function of the AGC circuit is to process an input IF signal to generate an IF signal with a fixed power level at the output of the AGC (regardless of the level of the input IF signal level). This fixed signal level is required for further IF processing, both within the RF-IF section and in a base-band processing unit. A conventional AGC circuit is typically designed as a closed loop AGC circuit comprising a gain variable amplifier (GVA) and some control hardware/software to control the gain of the GVA.

FIG. 1 is a block diagram of a conventional receiver comprising a single, closed loop AGC circuit according to the prior art. The receiver comprises an antenna 100 for receiving a RF signal. A LNA (low noise amplifier) 101 amplifies the RF signal and the amplified RF signal is filtered by a band-pass filter 102 to generate a RF signal (e.g., 2120 MHz to 2180 MHz). A down-converter 103 processes the bandpass-filtered RF signal to generate an IF signal. The IF signal comprises a plurality of channels (e.g., 12 channels with a channel bandwidth of 5 MHz in the range 2120 MHz to 2180 MHz). A SAW (surface acoustic wave) filter 104 filters the IF signal to select a desired channel within the IF signal. Each of these components and their respective functions are well-known the art.

The IF signal (i.e., selected channel) is fed to a closed loop AGC circuit 105 comprising a GVA 106 and an IF sensor and control signal generator 107. The GVA 106 amplifies the IF signal to predetermined power level. The IF signal is further processed by other IF processing units 108 (e.g. filters, amplifiers, etc). A power splitter 109 divides the IF power received from the IF processing units 108. A demodulator 110 receives an IF signal from one output from the power splitter 109 and extracts a baseband signal from the IF signal. Another output of the power splitter 109 is connected to the IF sensor and signal generator 107 to provide a feedback control of the gain of the GVA 106. In particular, the IF sensor and signal generator 107 comprises a logarithmic amplifier which converts the IF Sample signal to a voltage signal (based on the signal level of the IF Sample). The voltage level is compared to a Desired level setting signal to generate an appropriate control signal for the GVA 106 based on the comparison. The gain of the GVA 106 will be automatically adjusted to reach a balance under which the output signal of the GVA 106 will be fixed at the predetermined level.

One problem associated with the conventional AGC architecture based on the single, closed-loop design is that it does not provide high dynamic range with respect to the range of RF power levels that may be input to the receiver. A detailed analysis of the system of FIG. 1 with respect to dynamic range will now be provided. For purposes of illustration, it is assumed that the system of FIG. 1 is a wide-band receiver that operates in a frequency range of 2120 MHz to 2180 MHz. It is further assumed that the channel bandwidth is 5 MHz per channel and that the RF signal level input to the receiver varies between −25 dBm/channel and −115 dBm/channel. In addition, the following system requirements are assumed. First, the required signal-to-noise (S/N) ratio of the demodulated baseband signal should not be less than 0 dB (the baseband processing unit of the receiver has a processing gain, so the demodulated baseband data is not required to have a high margin of S/N ratio). Second, the signal level at the input of any device in the receiver chain should not be higher than −18 dBc of the $IIP_3$ value of that device (where the $IIP_3$ parameter denotes the input third inter-modulation cross-point in dBm) so as to ensure that the $IM_3$ of the receiver chain will be at least −36 dBc (where the $IM_3$ parameter is the third inter-modulation component in dBc). It is to be understood that the above system requirements are typical for WCDMA systems or CDMA- 2000 systems.

In addition, for illustrative purposes, the GVA 106 is assumed to have the performance parameters as set forth in Table 1 below. It is to be understood that these performance parameters correspond to parameters of a GVA of current technology such as the RF2607 GVA by RF Micro Devices. Another GVA device that may be considered is the Q5500 by QUALCOMM, which has similar performance as that of RF2607. As shown in Table 1, the noise figure (NF) and $IIP_3$ parameters of the illustrative GVA (e.g., RF2607) vary with the change in gain of the GVA.

TABLE 1

| Gain (dB) | 45 | 30 | 20 | 10 | 0 | −10 | −20 | −30 | −45 |
|---|---|---|---|---|---|---|---|---|---|
| NF (dB) | 5 | 6 | 10 | 18 | 25 | 34 | 42 | 48 | 60 |
| $IIP_3$ (dBm) | −46 | −34 | −23 | −18 | −14 | −12 | −7 | −4 | −3 |

In addition, for illustrative purposes, the signal level (SL), noise figure (NF), GVA gain (GA), and S/N ratio S/N at different locations in the receiver chain of FIG. 1 using a single, closed loop AGC topology are listed below in Table 2.

TABLE 2

| | | | | | | | | | | |
|---|---|---|---|---|---|---|---|---|---|---|
| SL at the input of the receiver (dBm) | −115 | −105 | −95 | −85 | −75 | −65 | −55 | −45 | −35 | −25 |
| SL at the input of the GVA (dBm) | −111 | −101 | −91 | −81 | −71 | −61 | −51 | −41 | −31 | −21 |
| GA of the GVA (dB) | 45 | 35 | 25 | 15 | 5 | −5 | −15 | −25 | −35 | −45 |
| SL at the output of the GVA (dBm) | −66 | −66 | −66 | −66 | −66 | −66 | −66 | −66 | −66 | −66 |
| NF of the GVA (dB) | 5.0 | 5.5 | 8.0 | 14 | 21 | 29 | 38 | 45 | 52 | 60 |
| NF at the output of the GVA (dB) | 6.9 | 7.0 | 7.9 | 11.3 | 17.3 | 25.1 | 34.0 | 41.0 | 48.0 | 56.0 |
| Noise floor at the output of the GVA (dBm) | −100 | −100 | −99.1 | −95.7 | −89.7 | −81.9 | −73.0 | −66.0 | −59.0 | −55.0 |
| S/N at the exit of the GVA (dB) | 34 | 34 | 33 | 30 | 24 | 16 | 7 | 0 | −7 | −11 |

The performance of the conventional single, closed loop AGC with respect to dynamic range will now be discussed in to detail with respect to the illustrative system parameters and values set forth in Tables 1 and 2 above. As noted above, the SL at the input of the receiver (i.e., antenna 100) is assumed to vary in the range from a low level of −115 dBm/channel to a high level of −25 dBm/channel (as shown in Table 2 varying in the range in increments of 10 dBm). The SL at the output of the GVA 106 is maintained at a fixed level in accordance with the closed loop requirement. As shown in Table 2, the fixed level at the output of the GVA 106 is assumed to be −66 dBm. This fixed level is based on factors such as (1) the assumed maximum available gain GA (e.g., 45 dBm) of the GVA for the lowest SL at the input of the receiver (e.g., −115 dBm) and (2) an assumed total gain of 4 dBm for the "receiver chain" up to the GVA 106 (as indicated in Table 2 by the difference between the SL at the input of the GVA and the SL at the input of the receiver). It is to be understood that the "receiver chain" up to the GVA 106 comprises the LNA 101, the BPF 102, the down-converter 103, and the IF SAW filter 104 as shown in FIG. 1.

As shown in Table 1, the $IIP_3$ of the GVA 106 is assumed to be −3 dBm when the gain of the GVA 106 is −45 dB (which is the gain of the VGA for the highest input signal level of −25 dBm as shown in Table 2 below) and the signal level at the input of the VGA 106 can not be higher than −21 dBm to satisfy the system $IM_3$ requirement. In particular, the following requirement should be satisfied:

$$|IM_3|=2*(IIP_3-(GA+SL_{max}))\geq 36(dBc) \quad \text{Eqn. 1}$$

where $IM_3$ is the third inter-modulation suppression in dB at the exit of the GVA and $IIP_3$ is the input third inter-modulation cross-point of the GVA in dBm (as noted above), where GA is the chained receiver gain up to the input of the GVA 106 in dB, and $SL_{max}$ is the maximum acceptable RF signal power level in dBm at the input of the receiver. Therefore, based on the assumed system requirements, the total chained gain of the receiver up to the GVA 106 can not be higher than 4 dB. It is further assumed that the chained noise figure of the receiver up to the input of the GVA 106 is 6 dB, a fare accessible value.

As indicated in Table 2, for a weak signal (−115 dBm/channel) the gain of the GVA 106 is set to its maximum +45 dB and its NF is 5 dB. The (chained) NF at the output of the GVA can be calculated using the following formula:

$$NF = 10 \log\left(F1 + \frac{(F2-1)}{GAN1}\right) \quad \text{Eqn. 2}$$

where NF denotes the chained noise figure at the output of a current component in db, F2 denotes the noise factor (linear) of the current component, F1 denotes the noise factor (linear) of a previous component (or the chained noise factor (linear) of all previous components), and GAN1 denotes the gain (linear (i.e., not dB)) of the previous component (or chained gain of all previous components) Therefore, using Eqn. 2, the NF at the output of the GVA for, the SL of −115 dBm/channel is equal to 10 log(3.98+(3.16−1)/2.51)=6.85 (dB). In addition, the corresponding noise floor at the output of the GVA is can be calculated using the following formula:

$$\text{NOISEFLOOR}=-174(dBm/Hz)+10 \log(BW)+NF \quad \text{Eqn. 3}$$

where −174(dBm/Hz) is the noise power density for a device at room temperature, BW is the channel bandwidth, and NF denotes the noise figure at the output of the current device (as calculated via Eqn. 2). Thus, the noise floor at the output of the GVA corresponding to the SL of −115 dBm/channel is equal to −174 (dBm/H$_z$)+10 log(5 MHz)+6.85=100.1 dBm/5 MH$_z$. The SL at the output of the GVA is −111+45=−66 (dBm/5 MH$_z$). The S/N ratio for the weak signal is calculated as the difference between the SL at the exit of the GVA and the noise floor at the output of the GV, i.e., −66 dBm−−100 dBm=+34 dB, which is very good.

On the other hand, for the strongest signal (−25 dBm/5 MH$_z$), the GVA gain is set to −45 dB to keep its output at the fixed level of −66 dBm. The NF at the output of the GVA is 10 log (3.98+($10^6$−1)/2.51)=56.0 dB, the noise floor at the output of the GVA is −55.0(dBm/5 MH$_z$), and the S/N ratio at the output of the GVA is −11 dB. This S/N ratio does not satisfy the system requirement.

Indeed, as is evident from Table 2, the dynamic range of the receiver using the conventional single, closed loop AGC 105 based on the assumed system parameters ranges from −45 dBm to −115 dBm, i.e., a dynamic range of 70 dB, since only within this range the S/N ratio at the exit of the GVA is 0 dB or better and $IM_3$ requirement is satisfied. The S/N performance of the conventional closed loop AGC 105 of FIG. 1 is poor when the input signal is strong. This is due to the GVA 106 having to operate in a high attenuation state for strong signals where its noise figure is non-linearly increased to a very high value. The dynamic range of the AGC 105 and, consequently, the receiver is thus limited when the GVA is forced to operate in such as high noise attenuation state.

Furthermore, the dynamic range of a receiver using the conventional single, closed loop AGC 105 of FIG. 1 is limited by the $IIP_3$ parameter of the GVA 106 employed in the AGC 105. Consequently, because the $IM_3$ system requirement (Eqn. 1) should be satisfied, either the chained receiver gain up to the input of the GVA (i.e., GA of Eqn. 1) or the maximum acceptable signal level (i.e., $SL_{max}$ of Eqn. 1) has to be limited.

Accordingly, there is a need for an improved AGC system that can overcome the above-mentioned problems and efficiently operate over a broad range of input signal levels. In particular, an AGC system that can provide high dynamic range of operation and improved S/N noise ratio performance, while keeping the inter-modulation components suppressed, is highly desirable.

SUMMARY OF THE INVENTION

The present invention is directed to a system and method for providing an automatic gain control circuit (AGC) with high dynamic range with improved signal-to-noise performance. An AGC according to the present invention in particularly useful in wide-band receivers whereby the AGC can operate over a broad range of input RF signal levels while maintaining a good signal-to-noise (SN) ratio performance over the entire signal range and maintaining inter-modulation components generated in the receiver at low levels.

In one aspect of the present invention, an automatic gain control (AGC) system comprises:

an open loop control system for sensing a power level of an input signal to the AGC system and preprocessing the input signal based on its sensed power level; and a closed loop control system comprising a gain variable amplifier (GVA) for variably amplifying the preprocessed input signal to maintain an output signal of the AGC at a predetermined power level, wherein the preprocessing of the input signal places the input signal within a power level range that maintains an optimized operation range for the GVA and maintains a signal-to-noise (S/N) ratio of the AGC system above a predetermined S/N level.

In another aspect of the present invention, the open loop control system of the AGC comprises:

a first control circuit for sensing the power level of the input signal and generating a control signal based on the sensed power level;

a plurality of signal preprocessing paths; and a switching circuit for switching the input signal to at least one of the plurality of preprocessing paths in response to the control signal.

In yet another aspect of the present invention, the plurality of signal preprocessing paths of the open loop control circuit comprise a first path comprising an attenuator for attenuating the input signal, a second path for directly passing the input signal from the open loop control system to the closed loop control system and a third path comprising an amplifier for amplifying the input signal.

These and other aspects, features and advantages of the present invention will be described or become apparent from the following detailed description of preferred embodiments, which is to be read in connection with the accompanying drawings.

BRIEF DESCRIPTION OF THE DRAWINGS

FIG. 4 is a block diagram of a control circuit according to an embodiment of the present invention that may be implemented in the AGC circuit of FIG. 2.

DETAILED DESCRIPTION OF PREFERRED EMBODIMENTS

Figure 1:
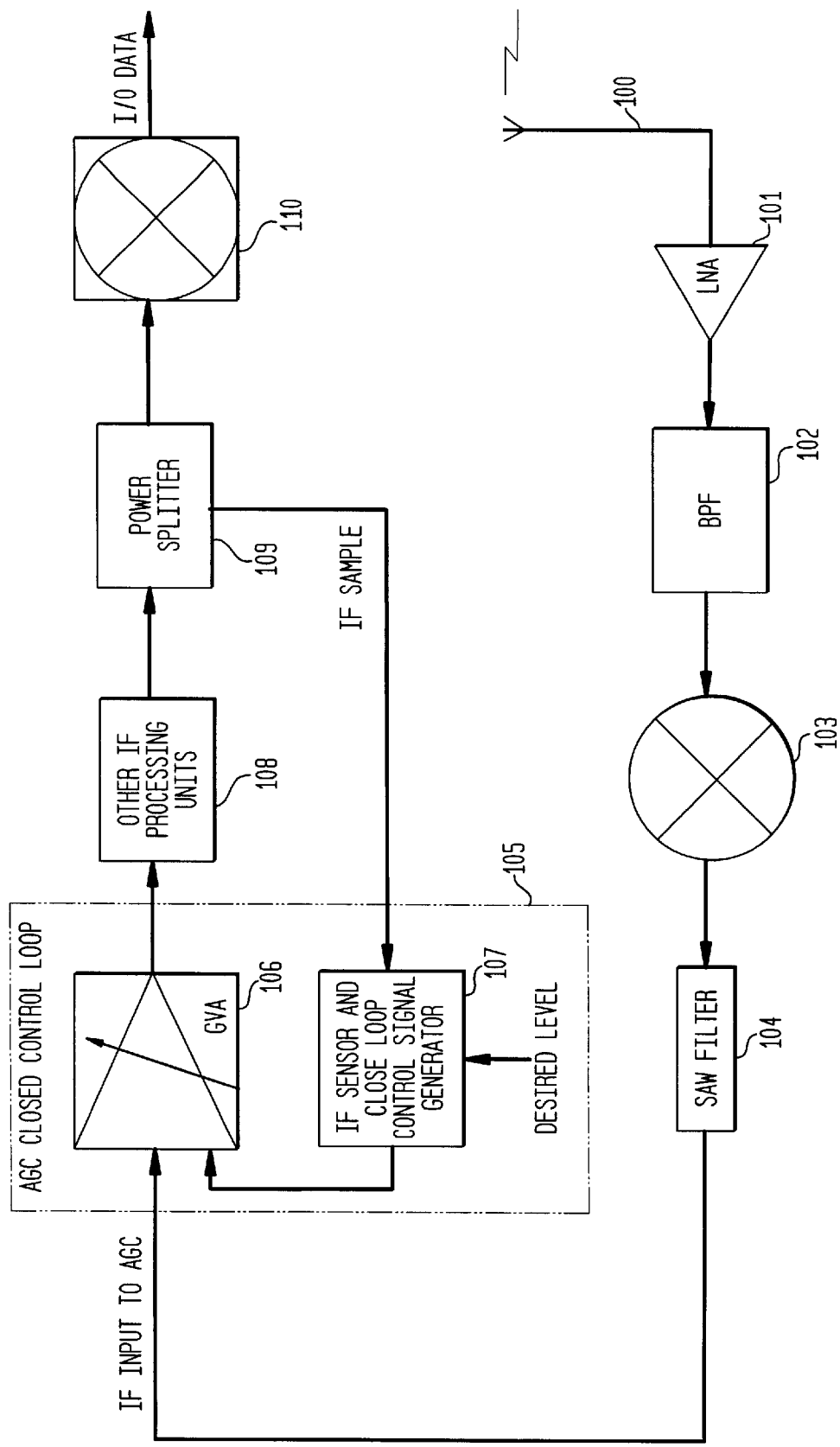
FIG. 1 is a block diagram of a receiver comprising a conventional automatic gain control circuit.

It is to be understood that the system and methods that are described herein in accordance with the present invention may be implemented in various forms of hardware, software, firmware, special purpose processors, or a combination thereof. Referring now to FIG. 2, a block diagram illustrates a receiver comprising an AGC circuit according to an embodiment of the present invention. A preferred AGC circuit comprises an open loop control circuit 200 and a closed loop control circuit 105. The closed loop control circuit 105 is similar in terms of architecture and operation as the closed loop control circuit 105 described above with reference to FIG. 1. As described in detail below, however, the open loop control circuit 200 preprocesses the IF signal input to the AGC so that the GVA 106 of the closed loop control circuit 105 operates in a region optimized for its performance. In particular, the open loop control circuit 200 will process the IF signal to ensure that the GVA 106 does not operate in a state of high attenuation where, as noted above, the noise figure of the GVA 106 is non-linearly increased.

In accordance with a preferred embodiment of the present invention, the open loop control circuit 200 comprises a first digitally controlled analog SP3T (single pole-three throw) switch 201 and a second digitally controlled analog SP3t switch 202. It is to be understood that any conventional switch that is suitable for the current application may be employed in the open loop control circuit 200 such as the commercially available SW247 switches by ANALOG DEVICES.

The open loop control circuit 200 further comprises a plurality of IF processing paths (P1, P2 and P3) between the switches 201 and 202, through which the IF input to the open loop of the AGC may be directed to the GVA 106 of the closed loop control circuit 105. The first path P1 (or "attenuation path") comprises an attenuator 203 for attenuating a strong IF input signal (e.g., higher than −35 dBm) by a predetermined, fixed factor. The attenuator 203 is of a conventional type comprising, for example, an analog attenuator or resistive pads. The second path P2 (or "through path") passes an intermediate level IF input signal (e.g., between −75 dBm and −35 dBm) through the open control loop circuit 200 to the closed control loop 105 without any pre-processing (e.g., without any attenuation or amplification). The third path P3 (or "amplification path") amplifies a weak IF input signal (e.g., below −75 dBm) by a predetermined, fixed factor (preferably through an IF amplifier 204 (e.g., LNA)).

The path (P1, P2 or P3) through which the IF input signal is passed is based on the switching state of the switches 201 and 202 in response to a control signal (CLT1, CLT2, CLT3) generated by a control circuit 205. In general, the control circuit 205 comprises an IF sensor for sensing the power level of an IF Sample1 signal and a control logic circuit for generating the control signal (CLT1, CLT2, CLT3) based on the sensed power level of the IF Sample 1 signal. The control signal (CLT1, CLT2, CLT3) activates the switches 201 and 202 in such a manner as to allow an AGC IF input signal to pass through path P1, P2 or P3. Both the IF Sample1 signal for the control circuit 205 of the open loop circuit 200 and the AGC IF input signal are received from separate outputs of a power splitter 206 located at the output of the SAW filter 104.

Figure 2:
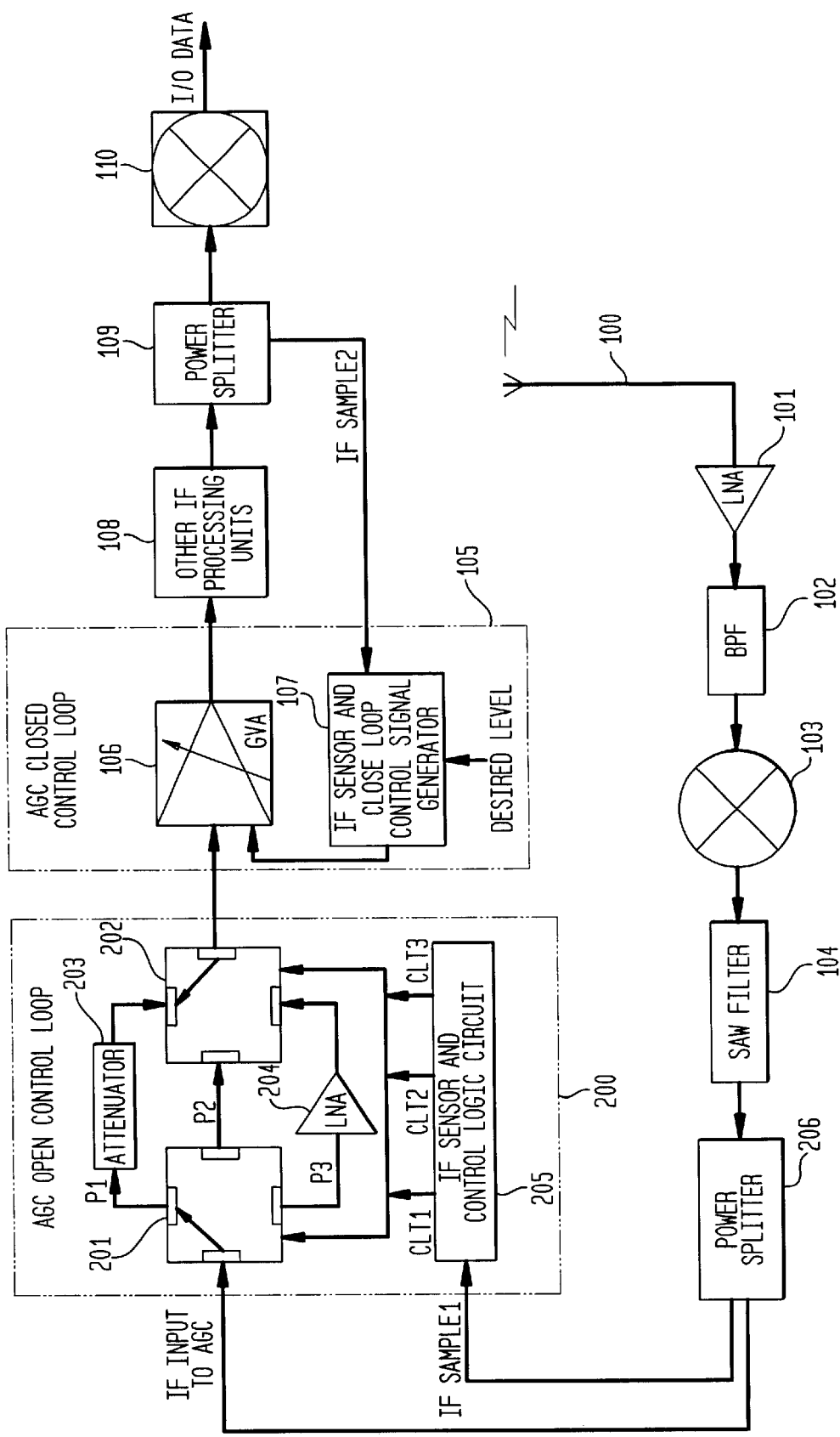
FIG. 2 is a block diagram of a receiver comprising an automatic cain control circuit according to an embodiment of the present invention.
Figure 3:
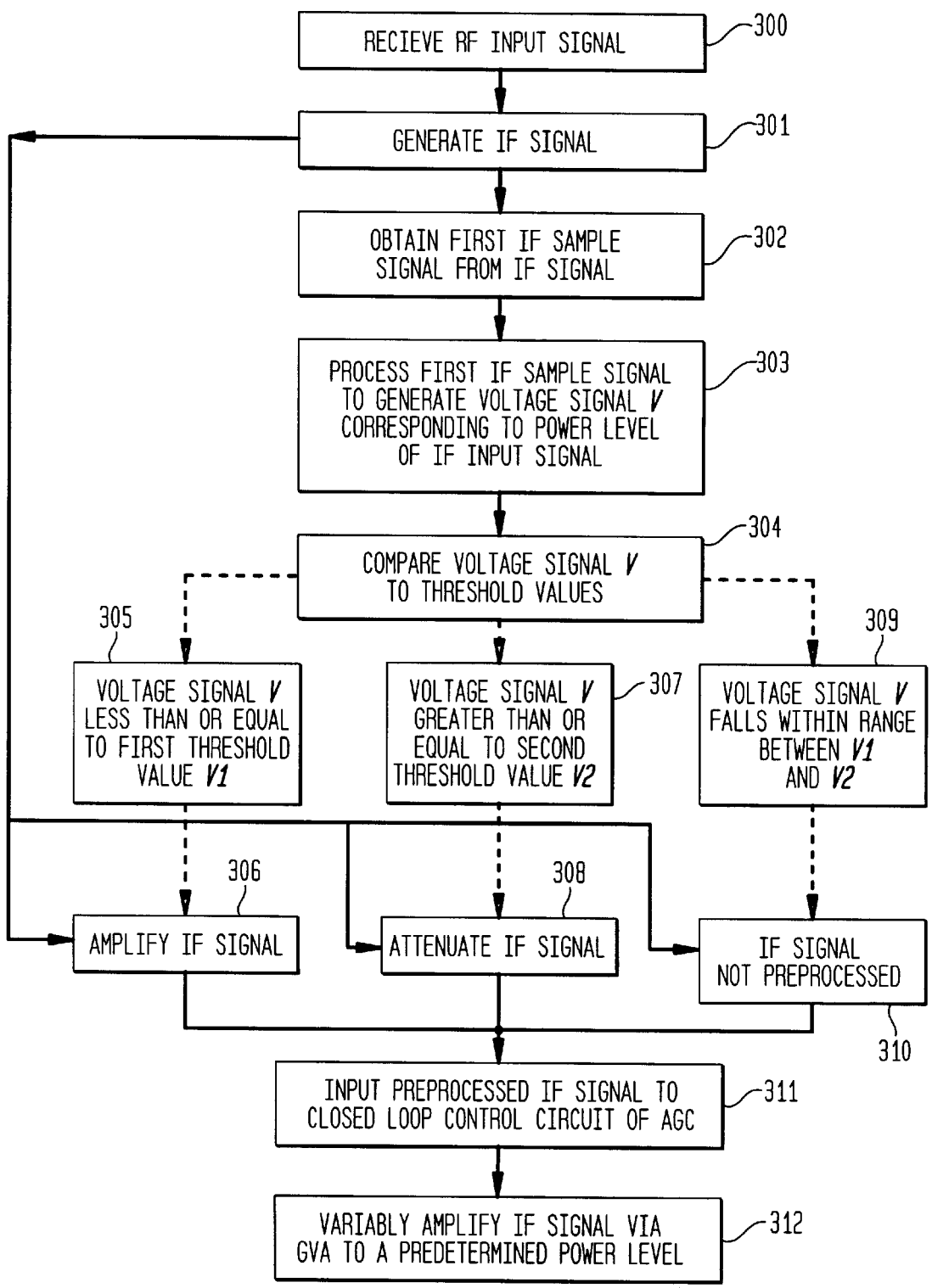
FIG. 3 is a flow diagram of a method for providing automatic gain control with high dynamic range according to one aspect of the present invention.

Referring now to FIG. 3, a flow diagram illustrates a method for providing automatic gain control according to one aspect of the present invention. In particular, FIG. 3 illustrates a method of operation of the AGC of the system of FIG. 2. Initially, a RF signal is input to the receiver (step 300). The RF input signal may range in power levels from about −115 dBm to about −25 dBm. The RF signal is processed to generate an IF signal (step 301). A first IF sample signal (IF Sample1 ) is obtained by sampling the IF signal (step 302) (e.g., obtained from one output of the power splitter 206 at the exit of the SAW filter 104). A voltage signal V is generated corresponding to the power level of the first IF sample signal (step 303). As discussed above, this conversion is performed via an IF sensor (e.g., logarithmic amplifier) portion of the control circuit 205 of the open loop control circuit 200.

The voltage V signal is then compared to one or more threshold values (step 304) to determine the manner by which the IF signal at the input of the AGC will be preprocessed (as illustrated by the dotted lines in FIG. 3 indicating optional preprocessing steps). For instance, if the voltage V is determined to be less than or equal to a first threshold value V1 ($V \leq V_1$) (step 305) (e.g., where V1 corresponds to a RF input power level $P \leq -75$ dBm), the IF power input to the AGC will be amplified by a predetermined, fixed level (e.g., 30 dB) (step 306). Particularly, in a preferred embodiment of FIG. 2, the IF signal input to the open loop control circuit 200 of the AGC will be switched to the third path P3 and amplified by the LNA 204 before being passed to the input of the closed loop control circuit 105 of the AGC.

If the voltage signal V is determined to be greater than or equal to a second threshold value $V_2$ ($V \geq V_2$) (step 307 ) (e.g., where V2 corresponds to a RF input level $P \geq -35$ dBm), the IF power input to the AGC will be attenuated by a predetermined, fixed amount (e.g., 30 db) (step 308). Particularly, in the preferred embodiment of FIG. 2, the IF signal input to the open loop control circuit 200 of the AGC will be switched to the first path P1 and attenuated by the attenuator 203 before being passed to the input of the closed loop control circuit 105 of the AGC.

If the voltage level V is determined to fall within a range between $V_1$ and $V_2$ ($V_1 < V < V_2$) (step 309), the IF power input to the AGC will not be preprocessed (step 310) and passed directly to the closed control loop circuit 105 of the AGC without any attenuation or amplification.

After the IF signal is preprocessed by the open loop control circuit 200, the signal is passed to the closed loop control circuit 105 of the AGC (step 311), wherein the preprocessed IF signal is variably amplified via the GVA 106 to produce a fixed power level at the output of the GVA (step 312), irrespective of the input power of the preprocessed IF signal. More specifically, this amplification process is performed by sampling the IF power at a desired point in the component chain after the output of the GVA 106 to obtain a second IF sample signal (IF Sample2) or feedback signal. As shown in the preferred embodiment of FIG. 2, the IF signal at the output of the GVA is further amplified by IF processing units 108. The IF Sample2 signal is obtained from the IF signal output from the IF processing units 108 (where the signal level is relatively high) by dividing the IF signal via the power splitter 109. Sampling the IF power at the output of the IF processing units 108 ensures that the best linear range of the sample signal sensor (e.g., logarithmic amplifier) is utilized.

The feedback signal is sent to the control circuit 107 of the closed loop control circuit 105 of the AGC wherein the IF Sample2 signal is processed to generate a control signal to continuously adjust the gain of the GVA 106 so as to maintain the power output of the GVA will at a predetermined fixed level. More specifically, the IF sensor portion of the circuit 107 converts the IF Sample2 signal into a voltage signal that corresponds to the power level of the IF Sample2 signal. This conversion is performed by a logarithmic amplifier (which may be the commercially available logarithmic amplifier AD8307 by ANAOLOG DEVICES). The output voltage of the IF sensor portion is compared with a Desired Level voltage signal via a difference amplifier in the control circuit 107. The Desired Level voltage signal represents the desired output power level of the GVA 106. The Desired Level may be provided by an adjustable reference voltage generator or from a command received by the receiver (via software control). The output of the difference amplifier is fed into an active integrator. Whenever a difference exists between the voltage signal and the Desired Level signal, the integrator will output a control signal based on such difference to adjust the gain of the GVA. This process is repeated until a balance is reached where the power output of the GVA will correspond to the power represented by the Desired Level, i.e., where there is no difference between the Desired Level signal and the voltage signal corresponding to the IF Sample2. At that time, the output signal of the GVA will be at the predetermined power level.

Advantageously, by preprocessing the IF signal via the open loop control circuit 200, the power level of the IF signal input to the GVA 106 is controlled so that the GVA 106 can operate in a region optimized for its performance. In particular, the preprocessing of the IF signal will prevent the GVA from having to operate in a state of high attenuation where its noise figure is non-linearly increased.

Referring now to FIG. 4, a block diagram illustrates a control circuit 205 according to a preferred embodiment of the present invention that may be implemented in the open loop control circuit 200. A preferred control circuit 205 comprises a logarithmic amplifier 400 that converts the IF Sample1 signal to a voltage V. It is to be understood that any suitable conventional logarithmic amplifier may be employed herein such as the commercially available AD 8307 by Analog Devices. The voltage V signal output from the logarithmic amplifier 400 is input to a voltage follower 401 (which acts as a buffer and driver circuit as is understood by those skilled in the art). The output of the voltage follower 401 is concurrently input to a first positive voltage level detector 402 and a second positive voltage level detector 404, which are in parallel branches. The first detector 402 determines if V is greater than a first threshold level V1 (i.e., if V>V1). The second detector 404 determines if V is greater than a second threshold level V2 (i.e., if V>V2), where V2>V1. The positive voltage level detectors 402 and 404 are preferably implemented using positive clamped comparators as is understood by those skilled in the art. The output of the detectors 402 and 404 will be a logic "0" to −TTL (transistor-transistor logic) signal when their corresponding condition is satisfied. It is to be understood that any suitable conventional voltage level detector may be employed herein such as by implementing the commercially available operational amplifier OPA4650U by ANALOG DEVICES.

A first inverting voltage follower 403 and a second inverting voltage follower 405 is connected to the output of the first detector 402 and the second detector 404, respectively. The first and second inverting voltage follower circuits 403 and 405 invert the logic level output from the respective first and second voltage level detectors 402 and 404 to logic "0" to +TTL levels (as well as act as buffers and drivers). It is to be understood that any suitable conventional inverting voltage follower may be employed herein such as by implementing the commercially available operational amplifier AD707R by ANALOG DEVICES.

The output of the first inverting voltage follower 403 (denoted as A2) and the output of the second inverting voltage follower 405 (denoted as A1) are input to a decoder 406 that generates three signals, CLT1, CLT2, and CLT3, based on the output signals A2 and A1. Whenever one of the three signals is set to TTL high, the other two signals will be set to TTL low. As indicated above, these control signals are used to control the switching state of the first and second switches 201 and 202 of the open loop control circuit 200 of FIG. 2. It is to be understood that any suitable conventional decoder may be employed herein such as the commercially available 74HC259D 3-to-8 decoder by ANALOG DEVICES (where one address input pin grounded). The control logic of the decoder 406 is illustrated below in Table 3,

TABLE 3

| A1 | A2 | CLT1 | CLT2 | CLT3 |
|----|----|------|------|------|
| 1  | 1  | 1    | 0    | 0    |
| 1  | 0  | 1    | 0    | 0    |
| 0  | 1  | 0    | 1    | 0    |
| 0  | 0  | 0    | 0    | 1    | where, A1 and A2 are input signal to the decoder and CLT1, CLT2, and CLT3 are output signals of the decoder. It is to be noted that the state of A1=1 and A2=0 does not actually exist. Indeed, if V>V2 then A1=1. Since V2>V1, then V>V1 and A2=1. In summary, if V>V2, the decoder will generate a control signal (1 0 0) and the attenuation path P1 (FIG. 2) is selected for attenuating the IF input signal. If V1<V<V2, the decoder will generate a control signal (0 1 0) and the "through path" P2 is selected to pass the IF input signal directly to the GVA of the closed loop control circuit. If V<V1, the decoder will generate a control signal (0 0 1) and the "amplification path" P3 is selected to amplify the IF input signal via LNA.

It is to be appreciated that by implementing the open loop control circuit 200 entirely in hardware (as illustrated by the preferred embodiments of FIGS. 2 and 4 ), no modification of the control software for the conventional control process of the closed loop control circuit 105 is necessary by virtue of employing the open control loop circuit 200 in the AGC topology according to the present invention. Consequently, the open loop control circuit 200 can be readily implemented in existing wireless communication systems without having to modify the existing AGC software for the closed loop control circuit 105.

A detailed analysis of the system of FIG. 2 with respect to dynamic range will now be provided with reference to the example values set forth in Table 4 below. For the purpose of illustrating the advantages and improved dynamic range performance associated with the system of FIG. 2 (as compared to the conventional system of FIG. 1), the same system parameters that were assumed in the above analysis of FIG. 1 will be assumed for the present analysis. For example, it is assumed that: (1) the system of FIG. 2 is a wide-band receiver that operates in a frequency range of 2120 MHz to 2180 MHz; (2) the channel band-width is 5 MHz; (3) the power level of the RF input signal varies from −25 dBm/channel to −115 dBm/channel; (4) the S/N ratio is required not less than 0 dB; and that (5) the signal level at the input of any device in the receiver chain is required not greater than −18 dBc of the $IIP_3$ value of that device.

It is further assumed that the total gain of the "receiver chain" up to the input of the open control circuit 200 of the AGC is 4 dB where the "receiver chain" of FIG. 2 includes the power splitter 206 and where the total gain of the IF input signal inlcudes the 3 db loss of power of the IF signal by virtue of generating the IF Samplel signal via the power splitter 206. It is also assumed that the chained noise figure of the "receiver chain" is 6 dB.

Based on the above assumptions, the signal level SL, noise figure NF, GVA gain GA, and S/N ratio at different positions of the receiver chain are listed in Table 4.

TABLE 4

| | | | | | | | | | |
|---|---|---|---|---|---|---|---|---|---|
| SL at input of receiver (dBm) | −115 | −105 | −95 | −85 | −75 | −65 | −55 | −45 | −35 | −25 |
| SL at input of AGC open loop (dBm) | −111 | −101 | −91 | −81 | −71 | −61 | −51 | −41 | −31 | −21 |
| SL at output of AGC open loop dBm) | −81 | −71 | −61 | −51 | −71 | −61 | −51 | −41 | −61 | −51 |
| NF up to output of AGC open loop (dB) | 6.2 | 6.2 | 6.2 | 6.2 | 6.0 | 6.0 | 6.0 | 6.0 | 26 | 26 |
| Noise floor at output of AGC open loop (dBm) | −101 | −101 | −101 | −101 | −101 | −101 | −101 | −101 | −81 | −81 |
| S/N at output of AGC open loop (dB) | 19.8 | 29.8 | 39.8 | 49.8 | 30 | 40 | 50 | 60 | 20 | 30 |
| SL at input of GVA (dBm) | −81 | −71 | −61 | −51 | −71 | −61 | −51 | −41 | −61 | −51 |
| SL at output of GVA (dBm) | −36 | −36 | −36 | −36 | −36 | −36 | −36 | −36 | −36 | −36 |
| GA of the GVA (dB) | 45 | 35 | 25 | 15 | 35 | 35 | 15 | 5 | 25 | 15 |
| NF of the GVA (dB) | 5.0 | 5.5 | 8.0 | 14 | 5.5 | 8.0 | 14 | 21 | 8.0 | 14 |
| S/N at output of GVA (dB) | 14.8 | 24.3 | 31.8 | 35.8 | 24.5 | 32 | 36 | 39 | 12 | 16 |

In particular, Table 4 illustrates the following:

(1) The RF input signal ranges in power levels from −115 dBm/channel to −25 dBm/channel;

(2) The SL of the IF signal at the input of the open loop control circuit of the AGC is 4 db greater than the SL at the input of the receiver based on the assumed chained gain of 4 db);

(3) For each of the SLs at the input of the receiver that are less than −75 dBm, the SL at the output of the open loop control circuit is 30 dB greater than the SL at the input of open loop control circuit (assuming that the IF signal is amplified in the open loop circuit at a fixed level of +30 dB);

(4) For each of the SLs at the input of the receiver that are equal to or greater than −35 dBm, the SL at the output of the open loop control circuit is 30 dB less than the SL at the input of open loop control circuit (assuming that the IF signal is attenuated in the open loop circuit by a fixed level of 30 dBm);

(5) For each of the SLs at the input of the receiver that are between −35 dBm and −75 dBm, the SL at the output of the open loop control circuit is equal to the SL at the input of open loop control circuit (assuming that the IF signal is neither attenuated nor amplified in the open loop circuit;

(6) The NF up to the output of the open loop control circuit of the AGC is: (a) 26 dB for the attenuated IF input signals (which accounts for the assumed chained NF of 6 dB and the NF of the attenuator 203 of FIG. 2); (b) 6.0 dB for non processed IF input signals (which is equal to the assumed chained NF); and (c) 6.2 dB for the amplified IF input signals (which accounts for the assumed chained NF of 6 db and the NF of the LNA 204 of FIG. 2);

(7) The Noise Floor at the output of the open loop control circuit of the AGC is calculated using Eqn. 3 above;

(8) The S/N ratio at the output of the open loop control circuit of the AGC is calculated as the difference between the SL at the output of the open loop control circuit and the Noise Floor at the output of the open loop control circuit, which for all input SL levels is shown to satisfy the system requirement of S/N being not less than 0 dB;

(9) The fixed level output from the GVA is set to −36 dBm, which is a result of the maximum available gain of the GVA (45 dB for the weak signal);

(10) The SL at the input of the GVA tracks the SL at the output of the open loop control circuit; (11) The SL to the input of the GVA is variably amplified (or attenuated) by setting the GA value of the GVA to ensure that the output of the GVA is at the predetermined level of −36 dBm;

(12) The NF of the GVA is based on the GA of the GVA (based on the parameters set forth in Table 1 above); and

(13) The S/N ratio at the output of the GVA is calculated as the difference between the SL and the noise floor at the output of the GVA, which for all input SL levels is shown to satisfy the system requirement of S/N being not less than 0 dB.

Therefore, as illustrated above, the system of FIG. 2 using the two loop AGC according to the present invention advantageously provides a 90 dB dynamic range, which is a 20 dB improvement over the conventional one loop AGC system of FIG. 1. The range of acceptable RF input signal levels can be extended by implementing the open loop control circuit in the AGC. Indeed, the limitation of the maximum acceptable RF power due to the requirement of satisfying the $IIP_3$ parameter of the GVA may be released to some extent as a result of the attenuation of strong signals by the open control loop circuit of the AGC.

In addition, the attenuation provided by the open loop control circuit in the AGC allows the entire receiver chain to be optimized since, e.g., the receiver chained gain up to the input of the AGC loop can be increased. This gain reassignment affords improved receiver performance improvement as well as dynamic range extension, as illustrated below with reference to the example set forth in the following Table 5:

TABLE 5

| | | | | | | | | | | | |
|---|---|---|---|---|---|---|---|---|---|---|---|
| SL at input of receiver (dBm) | −115 | −105 | −95 | −85 | −75 | −65 | −55 | −45 | −35 | −25 | −15 |
| SL at input of AGC open loop (dBm) | −100 | −90 | −80 | −70 | −60 | −50 | −40 | −30 | −20 | −10 | 0 |
| SL at output of AGC open loop (dBm) | −70 | −60 | −50 | −70 | −60 | −50 | −40 | −70 | −60 | −50 | −40 |
| NF up to output of AGC open loop (dB) | 6.0 | 6.0 | 6.0 | 6.0 | 6.0 | 6.0 | 6.0 | 25 | 25 | 25 | 25 |
| Noise floor at output of AGC open loop (dBm) | −101 | −101 | −101 | −101 | −101 | −101 | −101 | −82 | −82 | −82 | −82 |
| S/N at output of AGC open loop (dB) | 31 | 41 | 51 | 31 | 41 | 51 | 61 | 12 | 22 | 32 | 42 |
| SL at input of GVA (dBm) | −70 | −60 | −50 | −70 | −60 | −50 | −40 | −70 | −60 | −50 | −40 |
| SL at output of GVA (dBm) | −25 | −25 | −25 | −25 | −25 | −25 | −25 | −25 | −25 | −25 | −25 |
| GA of the GVA (dB) | 45 | 35 | 25 | 45 | 35 | 25 | 15 | 45 | 35 | 25 | 15 |
| NF of the GVA (dB) | 5.0 | 5.5 | 8.0 | 5.0 | 5.5 | 8.0 | 14 | 5.0 | 5.5 | 8.0 | 14 |
| S/N at output of GVA (dB) | 26.0 | 35.5 | 43.0 | 26.0 | 35.5 | 43.0 | 47.0 | 7.0 | 16.5 | 24.0 | 28.0 |

For the example set forth in Table 5, the analysis is similar to the above analysis with respect to the example set forth in Table 4 except that (1) the chained receiver gain up to the input of the open loop control circuit is assumed to be 15 dB (2) the RF input signal level varies in the range of −115 dBm/channel to −15 dBm/channel (3) the output of the GVA is set to −25 dBm and (4) the attenuation of attenuator 203 (FIG. 2) for the high IF power levels is set at −40 dBm.

As is evident from Table 5, the dynamic range of the receiver is extended to 100 dB, over a signal range from −115 dBm to −15 dBm. Indeed, as illustrated by the examples of Table 4 and Table 5, it is to be appreciated that the by changing the attenuation and amplification values of the open loop control circuit based on the desired range of RF input power, the dynamic range limitation of the receiver due to the AGC can be completely released. The dynamic range will be limited by other components in the receiver chain.

It is to be further appreciated that for receivers using the two loop AGC architecture according to the present invention, the dynamic range limitation due to the limited $IIP_3$ value of the GVA may be further released. Because of the open loop control process of the AGC loop which provides some attenuation of a strong signal before the signal is sent to the GVA, either the maximum acceptable signal level or the chained receiver gain up to the entrance of the first AGC loop may be increased. This will contribute to extension of receiver dynamic range too.

Although illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. An automatic gain control (AGC) system, comprising:
   an open loop control system for sensing a power level of an input signal to the AGC system and preprocessing the input signal based on its sensed power level; and
   a closed loop control system comprising a gain variable amplifier (GVA) for variably amplifying the preprocessed input signal to maintain an output signal of the AGC at a predetermined power level, wherein the preprocessing of the input signal places the input signal within a power level range that maintains an optimized operation range for the GVA and maintains a signal-to-noise (S/N) ratio of the AGC system above a predetermined S/N level.

2. The AGC system of claim 1, wherein the open loop control system comprises:
   a first control circuit for sensing the power level of the input signal and generating a control signal based on the sensed power level;
   a plurality of signal preprocessing paths; and
   a switching circuit for switching the input signal to at least one of the plurality of preprocessing paths in response to the control signal.

3. The AGC system of claim 2, wherein the plurality of signal preprocessing paths comprise a first path comprising an attenuator for attenuating the input signal, a second path for directly passing the input signal from the open loop control system to the closed loop control system and a third path comprising an amplifier for amplifying the input signal.

4. The AGC system of claim 2, wherein the switching circuit comprises a first switch and a second switch, wherein the first switch is connected to the input of the AGC system and to an input of each of the plurality of signal preprocessing paths, and wherein the second switch is connected to an output of each of the plurality of signal preprocessing paths and to an input of the closed loop control system.

5. The AGC system of claim 2, wherein the first control circuit comprises:
   a logarithmic amplifier for sensing the power level of the input signal and generating a voltage signal V based on the sensed power level;
   a first voltage level detector for comparing the voltage signal V to a first predetermined threshold and for generating a first detection signal if the voltage level V exceeds the first predetermined threshold;
   a second voltage level detector for comparing the voltage signal V to a second predetermined threshold and for generating a second detection signal if the voltage level V exceeds the second predetermined threshold; and
   a decoder for processing the first and second detection signals to generate the control signal.

6. The AGC system of claim 5, wherein the decoder generates the control signal to cause the switching circuit to switch the input signal to one of (1) a preprocessing path for attenuating the input, if both the first and second detection signals are generated, (2) a preprocessing path for amplifying the input signal, if both the first and second detection signals are not generated, and (3) a preprocessing path that passes the input signal directly to an input of the closed loop control circuit, if only the first detection level in generated.

7. The AGC system of claim 5, wherein the first control circuit further comprises:
   a first voltage follower circuit operatively connected between the logarithmic amplifier and the first and second voltage level detectors;
   a first inverting voltage follower circuit operatively connected between the first voltage level detector and the decoder; and
   a second inverting voltage follower circuit operatively connected between the second voltage level detector and the decoder.

8. The AGC system of claim 1, wherein the closed loop control circuit comprises:
   a gain variable amplifier (GVA) for variably amplifying the preprocessed input signal; and
   a second control circuit for sensing a power level of an amplified output signal of the GVA and for generating a gain control signal to adjust the gain of the GVA and maintain the power level of the amplified output signal at the predetermined power level.

9. A method for providing automatic gain control in a system comprising feedback control of a gain variable amplifier (GVA), comprising the steps of:
   receiving an input signal;
   sensing a power level of the input signal;
   preprocessing the input signal based on the sensed power level to maintain the power level of the input signal within a range that maintains a signal-to-noise (S/N) ratio of the system above a predetermined S/N level; and
   variably amplifying the preprocessed input signal using the GVA to maintain an output signal of the GVA at a predetermined level.

10. The method of claim 9, wherein the step of sensing the power level of the input signal comprises the steps of:
    sampling the power of the input signal to generate a first sample signal;
    converting the first sample signal into a voltage signal V corresponding to the power level of the input signal; and
    comparing the voltage signal V to at least a first threshold level and a second threshold level.

11. The method of claim 10, wherein the step of preprocessing the input signal comprises the step of one of amplifying the input signal if the voltage signal is equal to or less than the first threshold level, attenuating the input signal if the voltage signal V is equal to or greater than the second threshold level, and passing the input signal directly to the GVA if the voltage signal V falls between the first and second threshold level.

12. The method of claim 11, wherein the step of attenuating the input signal comprises the steps of:

generating a first control signal;

switching the input signal to a first path in response to the first control signal; and attenuating the input signal by an attenuator in the first path at a fixed attenuation level.

13. The method of claim 11, wherein the step of amplifying the input signal comprises the steps of:

generating a second control signal;

switching the input signal to a second path in response to the second control signal; and amplifying the input signal by an amplifier in the second path at a fixed amplification level.

14. A radio frequency (RF) receiver, comprising:

a downconverter for converting an RF input signal into a intermediate frequency (IF) signal;

a first power splitter for dividing the IF signal into an IF input signal and a first IF sample signal; and an automatic gain control (AGC) circuit comprising an open loop control circuit for sensing a power level of first IF sample signal and preprocessing the IF input signal based on the sensed power level of the first IF sample signal; and a closed loop control system for variably amplifying the preprocessed IF input signal to maintain an output signal of the AGC at a predetermined power level, wherein the preprocessing of the IF input signal places the power level of the IF input signal within a range that maintains a signal-to-noise (S/N) ratio of the receiver system above a predetermined S/N level.

15. The receiver of claim 14, wherein the open loop control circuit comprises:

a first control circuit for sensing the power level of the first IF sample signal and generating a control signal based on the sensed power level;

a plurality of IF signal preprocessing paths; and a switching circuit for switching the IF input signal to at least one of the plurality of IF preprocessing paths in response to the control signal.

16. The receiver of claim 15, wherein the plurality of IF signal preprocessing paths comprise a first path comprising an attenuator for attenuating the IF input signal, a second path for directly passing the IF input signal from the open loop control circuit to the closed loop control circuit and a third path comprising an amplifier for amplifying the IF input signal.

17. The receiver of claim 15, wherein the switching circuit comprises a first switch and a second switch, wherein the first switch is connected to the input of the open loop control circuit and to an input of each of the plurality of IF signal preprocessing paths, and wherein the second switch is connected to an output of each of the plurality of signal preprocessing paths and to an input of the closed loop control circuit.

18. The receiver of claim 15, wherein the first control circuit comprises:

a logarithmic amplifier for sensing the power level of the first sample signal and generating a voltage signal V corresponding to the IF input signal;

a first voltage level detector for comparing the voltage signal V to a first predetermined threshold and for generating a first detection signal if the voltage level V exceeds the first predetermined threshold;

a second voltage level detector for comparing the voltage signal V to a second predetermined threshold and for generating a second detection signal if the voltage level V exceeds the second predetermined threshold; and a decoder for processing the first and second detection signals to generate the control signal.

19. The receiver of claim 18, wherein the decoder generates the control signal to cause the switching circuit to switch the IF input signal to one of (1) a preprocessing path for attenuating the IF input signal, if both the first and second detection signals are generated, (2) a preprocessing path for amplifying the IF input signal, if both the first and second detection signals are not generated, and (3) a preprocessing path that passes the IF input signal directly to an input of the closed loop control circuit, if only the first detection level in generated.

20. The receiver of claim 18, wherein the first control circuit further comprises:

a voltage follower circuit operatively connected between the logarithmic amplifier and the first and second voltage level detectors;

a first inverting voltage follower circuit operatively connected between the first voltage level detector and the decoder; and a second inverting voltage follower circuit operatively connected between the second voltage level detector and the decoder.

21. The receiver of claim 14, wherein the closed loop control circuit comprises:

a gain variable amplifier (GVA) for variably amplifying the preprocessed IF input signal; and a second control circuit for sensing a power level of an amplified output signal of the GVA and for generating a gain control signal to adjust the gain of the GVA and maintain the power level of the amplified output signal at the predetermined power level.

22. The receiver of claim 14, wherein the RF signal has a power level in the range of about −115 dBm to about −15 dBm.

* * * * *